(12) United States Patent
Takii

(10) Patent No.: US 8,988,622 B2
(45) Date of Patent: Mar. 24, 2015

(54) ORGANIC LIGHT EMITTING DIODE DISPLAY AND MANUFACTURING METHOD THEREOF

(71) Applicant: Samsung Display Co., Ltd., Yongin, Gyeonggi-do (KR)

(72) Inventor: Kenji Takii, Yongin (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 14/151,140

(22) Filed: Jan. 9, 2014

(65) Prior Publication Data

US 2014/0367655 A1    Dec. 18, 2014

(30) Foreign Application Priority Data

Jun. 13, 2013    (KR) .......................... 10-2013-0067926

(51) Int. Cl.
*G02F 1/136*    (2006.01)
*H01L 27/32*    (2006.01)
*H01L 51/56*    (2006.01)

(52) U.S. Cl.
CPC .............. *H01L 27/326* (2013.01); *H01L 51/56* (2013.01)
USPC ..................... 349/42; 349/19; 257/98; 438/30

(58) Field of Classification Search
USPC ............................ 257/98; 438/30; 349/19, 42
See application file for complete search history.

(56) References Cited

U.S. PATENT DOCUMENTS

2004/0081768 A1\*    4/2004    Furusawa et al. ............. 427/421

FOREIGN PATENT DOCUMENTS

| | | |
|---|---|---|
| JP | 2004-330136 | 11/2004 |
| JP | 2011-113654 | 6/2011 |
| JP | 4985302 | 5/2012 |
| KR | 10-2012-0102534 | 9/2012 |

\* cited by examiner

*Primary Examiner* — David Vu
*Assistant Examiner* — Brandon Fox
(74) *Attorney, Agent, or Firm* — Knobbe Martens Olson & Bear LLP

(57) ABSTRACT

An OLED display includes an organic layer formed using a printing method. A method for manufacturing the OLED display includes: forming a pixel circuit on a substrate; forming a planarization layer on the substrate to cover the pixel circuit, where the planarization layer includes heat generation particles; forming a pixel electrode and a pixel defining layer on the planarization layer; forming an organic layer by discharging ink on the pixel electrode and drying the ink by generating heat from the heat generation particles through microwave irradiation; and forming a common electrode on the organic layer.

18 Claims, 10 Drawing Sheets

FIG.10
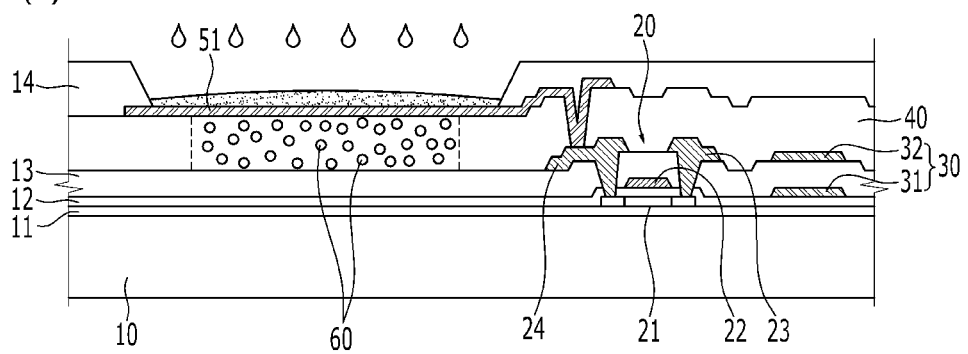
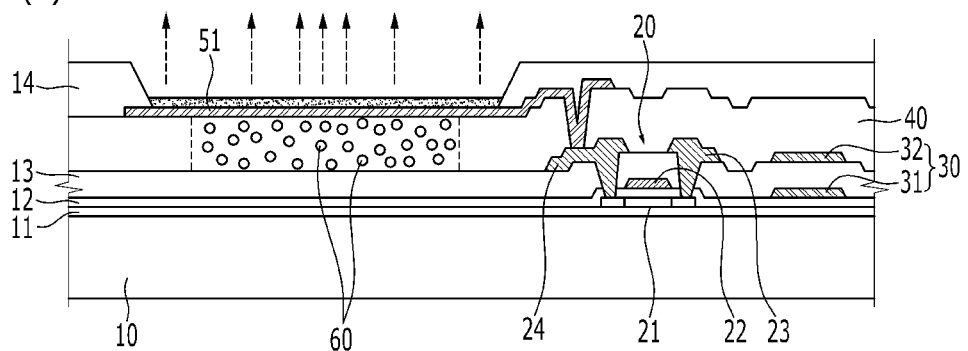
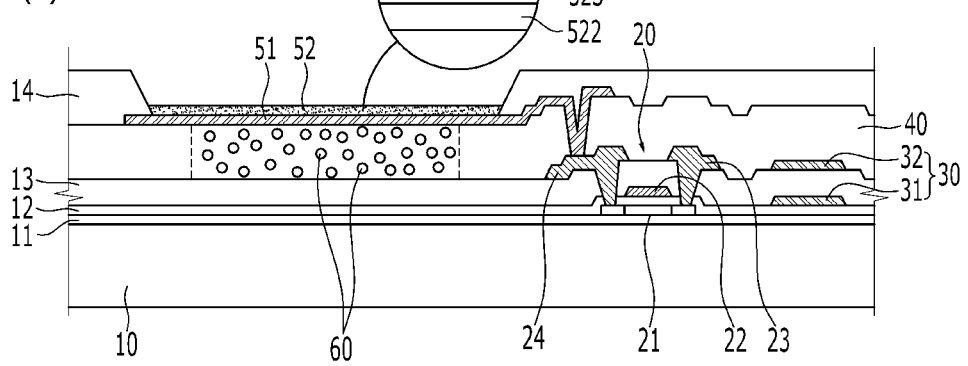

ORGANIC LIGHT EMITTING DIODE DISPLAY AND MANUFACTURING METHOD THEREOF

CROSS-REFERENCE TO RELATED APPLICATIONS

This application claims priority to, and the benefit of, Korean Patent Application No. 10-2013-0067926 filed in the Korean Intellectual Property Office on Jun. 13, 2013, the entire contents of which are incorporated herein by reference.

BACKGROUND

1. Field

Example embodiments relate to an OLED display including an organic layer formed using a printing method, and a manufacturing method thereof.

2. Description of the Related Technology

An organic light emitting diode (OLED) display includes a plurality of pixels, and displays an image using the pixels. Each pixel includes an organic light emitting diode including a pixel electrode, an organic layer, and a common electrode. The organic layer includes an emission layer (EML), and further includes at least one of a hole injection layer (HIL), a hole transport layer (HTL), an electron transport layer (ETL), and an electron injection layer (EIL).

The organic layer including the emission layer (EML) may be partially formed using a printing method such as inkjet or nozzle printing. The printing method provides ink for each pixel unit on a substrate where a pixel electrode and a pixel defining layer are formed, and dries the coated ink. Heat drying, step-down drying, vacuum drying, infrared drying, and the like may be used, wherein a solvent of the ink is evaporated during the drying process.

The above information disclosed in this Background section is only for enhancement of understanding of the background of the invention and therefore it may contain information that does not form the prior art that is already known in this country to a person of ordinary skill in the art.

SUMMARY OF CERTAIN INVENTIVE ASPECTS

Example embodiments have been made in an effort to provide an organic light emitting diode (OLED) display of which the organic layer is formed using a printing method, and thickness uniformity of the organic layer can be improved by precisely controlling a condition for drying ink for each pixel unit, and a method for manufacturing the OLED display.

An OLED display according to one embodiment includes: a pixel circuit formed on a substrate; a planarization layer covering the pixel circuit; and an organic light emitting diode disposed on the planarization layer, the organic light emitting diode including a pixel electrode, an organic layer, and a common electrode. The planarization layer includes heat generation particles emitting heat through microwave irradiation.

The organic layer may include an emission layer, and at least one of a hole injection layer, a hole transport layer, an electron transport layer, and an electron injection layer. The at least one of the hole injection layer and the hole transport layer may be disposed between the pixel electrode and the emission layer, and the at least one of the hole injection layer and the hole transport layer and the emission layer may be formed using a printing method. The heat generation particles may include at least one of a metal, a ceramic, or a silicon carbide-based material.

The planarization layer may be divided into a first area corresponding to a center portion of the organic layer and a second area corresponding to a peripheral portion of the organic layer, and the heat generation particles may be dispersed in the first area. Alternatively, the planarization layer may be formed of a first planarization layer including the heat generation particles and a second planarization layer not including the heat generation particles.

The first planarization layer may correspond to the center portion of the organic layer and the second planarization layer may correspond to the peripheral portion of the organic layer. Sides of the first planarization layer and sides of the second planarization layer may include inclined surfaces, and a quantity of heat generation particles may be gradually decreased moving farther away from the center of the organic layer.

The substrate may be divided into a center portion and a peripheral portion. A number of heat generation particles disposed in the center portion of the substrate may be different from a number of heat generation particles disposed in the peripheral portion of the substrate. The number of heat generation particles disposed in the center portion of the substrate may be greater than the number of heat generation particles disposed in the peripheral portion of the substrate.

The heat generation particles may include first heat generation particles disposed in the center portion of the substrate and second heat generation particles disposed in the peripheral portion of the substrate and generating a different amount of heat than an amount of heat generated from the first heat generation particles. The amount of heat generated from the first heat generation particles may be greater than the amount of heat generated from the second heat generation particles.

A method for manufacturing an OLED display according to one embodiment includes: forming a pixel circuit on a substrate; forming a planarization layer on the substrate to cover the pixel circuit, where the planarization layer includes heat generation particles; forming a pixel electrode and a pixel defining layer on the planarization layer; forming an organic layer by discharging ink on the pixel electrode and drying the ink by generating heat from the heat generation particles through microwave irradiation; and forming a common electrode on the organic layer.

Forming of the planarization layer may include forming a first planarization layer corresponding to a center portion of the organic layer and including the heat generation particles and forming a second planarization layer corresponding to a peripheral portion of the organic layer may be formed with a time gap. Sides of the first planarization layer and sides of the second planarization layer may be formed with inclined surfaces, and a number of heat generation particles may be gradually decreased moving farther away from a center of the organic layer.

The substrate may be divided into a center portion and a peripheral portion. A number of heat generation particles disposed in the center portion may be different from a number of heat generation particles disposed in the peripheral portion. Heat generation particles disposed in the center portion generate an amount of heat different from an amount of heat generated from heat generation particles disposed in the peripheral portion.

The organic layer may include a hole injection layer, a hole transport layer, and an emission layer. The ink discharging and drying process may be performed on at least one of the hole injection layer, the hole transport layer, and the emission layer.

The OLED display can precisely control a temperature of a center portion of a pixel and a temperature of a peripheral portion of the pixel for each pixel unit by disposing heat generation particles in a planarization layer. Therefore, the thickness uniformity of the organic layer can be increased by uniformly control the evaporation speed of a solvent in each pixel, and accordingly, a light emission characteristic and efficiency and life-span of the OLED display can be improved.

BRIEF DESCRIPTION OF THE DRAWINGS

FIG. 10 is an enlarged cross-sectional view of the OLED display during the manufacturing method of FIG. 8.

DETAILED DESCRIPTION OF CERTAIN INVENTIVE EMBODIMENTS

The present invention will be described more fully hereinafter with reference to the accompanying drawings, in which certain embodiments are shown. As those skilled in the art would realize, the described embodiments may be modified in various ways, without departing from the spirit or scope of the present invention.

In the specification, unless explicitly described to the contrary, the word "comprise" and variations such as "comprises" or "comprising" will be understood to imply the inclusion of stated elements but not the exclusion of any other elements. In addition, it will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" means positioning on or below the object portion, and does not essentially mean positioning on the upper side of the object portion based on a gravity direction.

A light emission characteristic and efficiency and life-span of an OLED display are influenced by thickness uniformity of the organic layer, and therefore the thickness of the organic layer should be uniform. However, the thickness of the organic layer cannot be easily controlled due to various process factors such as the shape of a pixel, the size of a pixel, ink characteristics, solvent characteristics, and drying conditions. Furthermore, ink is provided for each pixel unit but the drying process is performed for each substrate unit, and therefore the drying conditions cannot be precisely controlled for each pixel unit.

Figure 1:
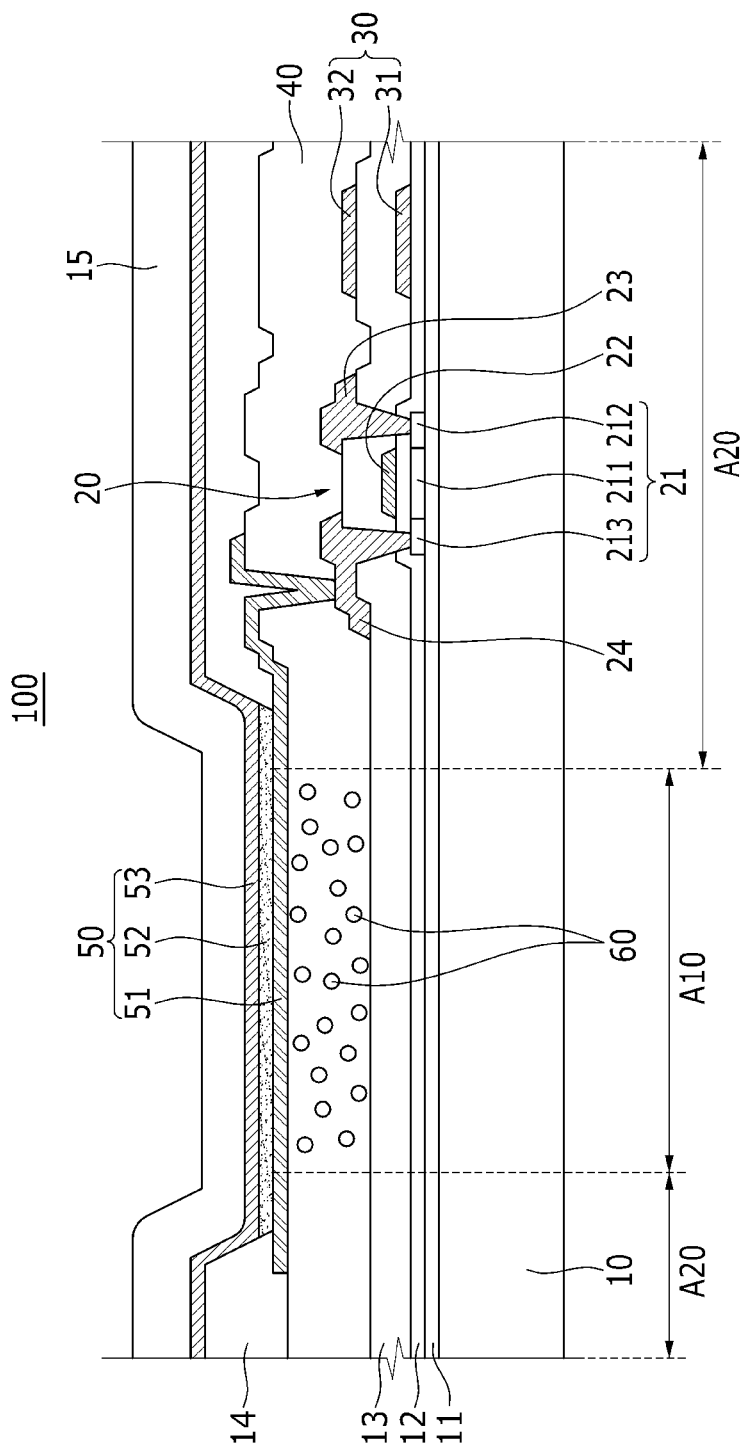
FIG. 1 is a partially enlarged cross-sectional view of an OLED display according to an embodiment.
Figure 2:
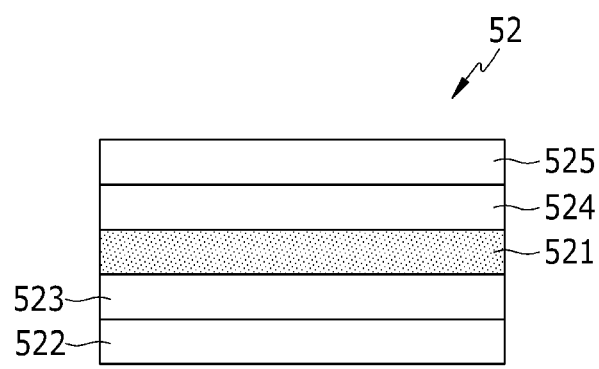
FIG. 2 is an enlarged cross-sectional view of an organic layer in the OLED display of FIG. 1.

FIG. 1 is a partially enlarged cross-sectional view of an organic light emitting diode (OLED) display according to an embodiment, and FIG. 2 is an enlarged cross-sectional view of an organic layer of the OLED display of FIG. 1.

Referring to FIG. 1, an OLED display 100 includes a substrate 10, pixel circuits 20 and 30 formed on the substrate 10, a planarization layer 40, a pixel defining layer 14, and an organic light emitting diode 50.

The substrate 10 may be a rigid substrate such as, for example, glass, or a flexible substrate such as, for example, a polymer film. A buffer layer 11 is formed on the substrate 10. The buffer layer 11 is formed of an inorganic layer, and may include, for example, $S_iO_2$ or $S_iN_x$. The buffer layer 11 provides a flat surface for forming the pixel circuits 20 and 30, and suppresses permeation of moisture and foreign particles into the pixel circuits 20 and 30 and the organic light emitting diode 50.

A thin film transistor 20 and a capacitor 30, as the pixel circuits, are formed on the buffer layer 11. The thin film transistor 20 includes a semiconductor layer 21, a gate electrode 22, and source and drain electrodes 23 and 24. The semiconductor layer 21 may be formed of, for example, a polysilicon or oxide semiconductor, and includes a channel area 211 in which impurities are not doped and a source area 212 and a drain area 213 in which impurities are doped at respective sides of the channel area. When the semiconductor layer 21 is formed of the oxide semiconductor, a separate protective layer for protecting the semiconductor layer 21 may be added.

A gate insulating layer 12 is formed between the semiconductor layer 21 and the gate electrode 22, and an interlayer insulating layer 13 is formed between the gate electrode 22 and the source and drain electrodes 23 and 24. In FIG. 1, the thin film transistor 20 is formed with a top gate structure, but the structure of the thin film transistor 20 is not limited thereto.

The capacitor 30 may include a first capacitor plate 31 formed on the gate insulating layer 12 and a second capacitor plate 32 formed on the interlayer insulating layer 13. The first capacitor plate 31 may be made of the same material as the gate electrode 22, and the second capacitor plate 32 may be made of the same material as the source and drain electrodes 23 and 24. The second capacitor plate 32 may be connected with the source electrode 23.

In FIG. 1, the thin film transistor 20 is a driving thin film transistor, and the pixel circuits 20 and 30 further include switching thin film transistors (not shown). The switching thin film transistor is provided as a switching element that selects a pixel for light emission, and the driving thin film transistor applies power for light emission of the selected pixel to the corresponding pixel. The pixel represents a minimum unit for light emission, and the pixel circuits 20 and 30 include at least two thin film transistors 20 and at least one capacitor 30.

The planarization layer 40 is formed on the source and drain electrodes 23 and 24 and the second capacitor plate 32. The planarization layer 40 may include an organic material such as, for example, benzocyclobutene (BCB), an acryl resin, an epoxy resin, and a phenol resin, or an inorganic material such as, for example, $S_iN_x$, and may be formed of a combination of an organic layer and an inorganic layer. The planarization layer 40 forms a via hole that partially exposes the drain electrode 24, and the organic light emitting diode 50 is formed on the planarization layer 40.

The organic light emitting diode 50 includes a pixel electrode 51, an organic emission layer 52, and a common electrode 53. The pixel electrode 51 is formed in each pixel, and is connected with the drain electrode 24 of the thin film transistor 20. The pixel electrode 51 is surrounded by the pixel defining layer 14 that partitions pixel areas, and the organic emission layer 52 is formed on the exposed pixel electrode 51. The common electrode 53 is formed throughout the display area above the organic emission layer 52 and the pixel defining layer 14.

Referring to FIG. 2, the organic layer 52 includes an emission layer 521. The emission layer 521 may be one of a red emission layer, a green emission layer, and a blue emission layer. Alternatively, the organic emission layer 521 may be a white emission layer, or may be formed in a layered structure of a red emission layer, a green emission layer, and a blue emission layer. When the organic emission layer 521 emits light of a white color, the OLED display may further include a color filter (not shown).

The pixel electrode 51 may be an anode which is a hole injection electrode and the common electrode 53 may be a cathode which is an electron injection electrode. The opposite case is also feasible. Holes injected from the anode, and electrons injected from the cathode, are combined in the organic emission layer 521 to generate excitons, and light emission is performed while the excitons discharge energy.

In addition to the emission layer 521, the organic layer 52 further includes at least one of a hole injection layer 522, a hole transport layer 523, an electron transport layer 524, and an electron injection layer 525. The hole injection layer 522 and the hole transport layer 523 are provided between the anode and the emission layer 521, and the electron transport layer 524 and the electron injection layer 525 are provided between the cathode and the emission layer 521.

One of the pixel electrode 51 and the common electrode 53 may be formed of a reflective layer and the other may be formed of a semi-transmissive or transparent conductive layer. Light emitted from the organic emission layer 521 is reflected by the reflective layer and emitted to the outside through the transparent conductive layer. In the case of the semi-transmissive layer, part of the light emitted from the organic emission layer 521 is reflected again to the reflective layer to form a resonance structure.

A thin film encapsulation layer or an encapsulation substrate is formed on the organic light emitting diode 50. In FIG. 1, the thin film encapsulation layer 15 is illustrated. The thin film encapsulating layer 15 encapsulates the organic light emitting diode 50 from the external environment containing moisture and oxygen to suppress deterioration in the organic light emitting diode 50 due to moisture and oxygen. The thin film encapsulating layer 15 may be formed of a configuration in which a plurality of organic layers and a plurality of inorganic layers are alternately stacked one by one.

In the above-described configuration, at least one of the layers forming the organic layer 52 is formed by a printing method such as inkjet or nozzle printing. For example, when the pixel electrode 51 functions as an anode, the hole injection layer 522, the hole transport layer 523, and the emission layer 521 of the organic layer 52 may be formed using the printing method.

The printing method includes a process for discharging liquid-type ink to pixel units on the substrate 10 where the pixel electrode 51 and the pixel defining layer 14 are formed, and drying the coated ink. The ink contains an organic material and a solvent, and the solvent is evaporated during the drying process.

Micro-liquid droplets have different drying speeds depending on locations due to a coffee stain phenomenon. The drying speed at the periphery of the micro-liquid droplets is faster than the drying speed in the center of the micro-liquid droplets. In order to form the organic layer 52 with uniform thickness, the drying speed in the micro-liquid droplets should be uniform.

In one embodiment, the planarization layer 40 includes heat generation particles 60 emitting heat by microwave irradiation. The microwave irradiation is also referred to as ultra high frequency (UHF) irradiation, and microwaves having a frequency from about 300 MHz to about 300 GHz may be used.

The heat generation particles 60 are particles emitting heat when the microwaves are applied, and may include at least one of metal, ceramic, and silicon carbide-based materials of less than about 100 nm in size. In case of a metal, nickel may be included for example, and in case of a ceramic, an ion oxide, a vanadium oxide, a lead oxide, a copper oxide, a bismuth oxide, and the like may be used, as examples.

The planarization layer 40 is divided into a first area A10 corresponding to the center portion of the organic layer 52 and a second area A20 corresponding to a peripheral portion of the organic layer 52, and the heat generation particles 60 are dispersed in the first area A10. The heat generation particles 60 are disposed under the center portion of the organic layer 52 rather than being evenly dispersed throughout the planarization layer 40. The second area A20 may be defined to be the entire area of the planarization layer 40 excluding the first area A10.

Since the planarization layer 40 includes the heat generation particles 60, the organic layer 52 is dried using the heat of the heat generation particles 60 during a drying process using the microwaves. The heat discharged from the heat generation particles 60 is dispersed in all directions, and therefore a sufficient amount of heat is provided to the edge of the organic layer 52 for drying. However, the heat generation particles 60 are converged below the center portion of the organic layer 52, and therefore the temperature of the center portion of the organic layer 52 is higher than the temperature of the edge of the organic layer 52.

The evaporation speed of the solvent is faster at the edge of the organic layer 52 than in the center portion of the organic layer 52, so the evaporation speed of the solvent of each pixel can be controlled to be uniform by increasing the temperature of the center portion of the organic layer 52 to be higher than the temperature of the peripheral portion of the organic layer 52. Accordingly, the organic layer 52 can have a uniform thickness for each pixel unit.

As described, in the OLED display 100, the temperature of a center portion and the temperature of a peripheral portion of each pixel can be precisely controlled for each pixel unit. Therefore, the thickness uniformity of the organic layer 52 can be increased by controlling the evaporation speed of the solvent of each pixel to be uniform, and accordingly, a light emission characteristic and efficiency and life-span can be improved.

Figure 3:
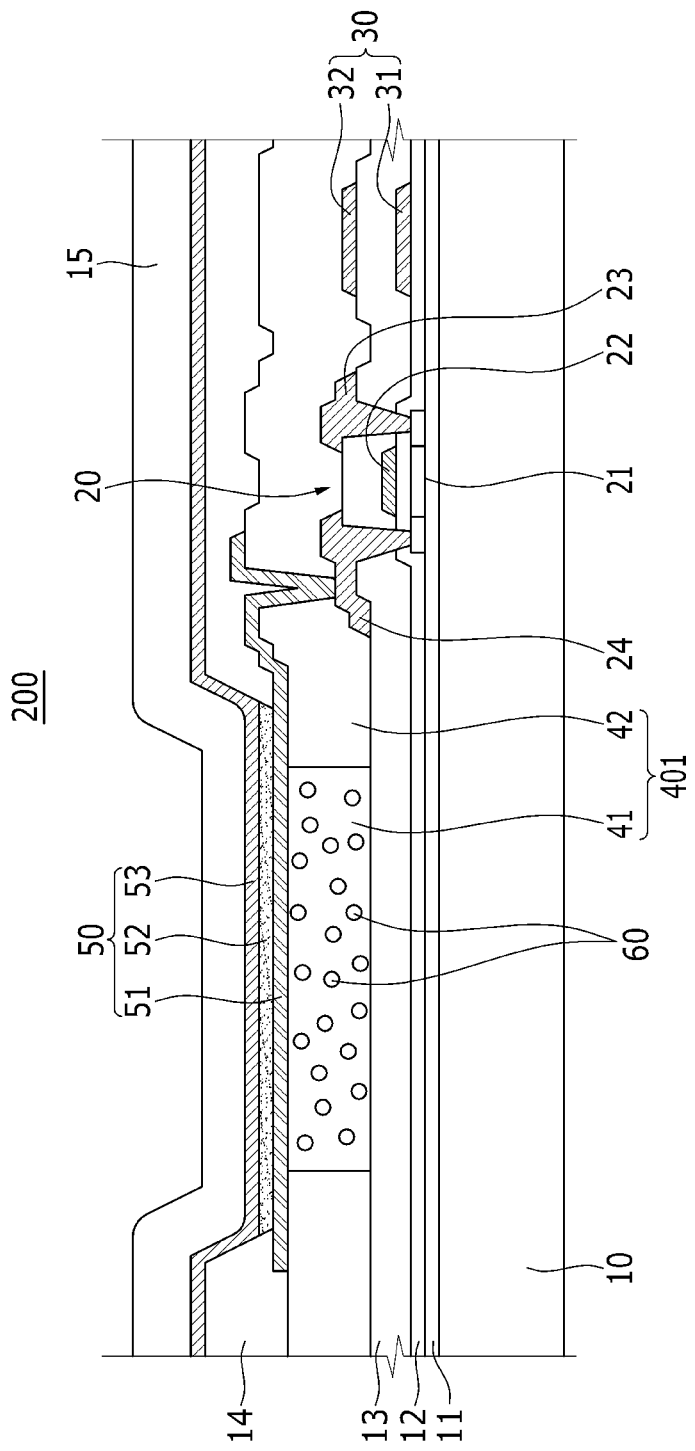
FIG. 3 is a partially enlarged cross-sectional view of an OLED display according to an embodiment.

FIG. 3 is a partially enlarged cross-sectional view of an OLED display according to an embodiment.

Referring to FIG. 3, an OLED display 200 is formed of the same configuration of the OLED display of FIG. 1, except that a planarization layer 401 is formed of a first planarization layer 41 including heat generation particles 60 and a second planarization layer 42 that does not include the heat generation particles 60.

The first planarization layer 41 is disposed corresponding to a center portion of the organic layer 52, and the second planarization layer 42 is disposed corresponding to a peripheral portion of the organic layer 52. The first planarization layer 41 and the second planarization layer 42 contact each other at sides thereof, and have the same thickness. Sides of the first planarization layer 41 and sides of the second planarization layer 42 may be perpendicular to the substrate, and the first planarization layer 41 and the second planarization layer 42 may be formed with a time gap.

In the embodiment of FIG. 3, the planarization layer 401 can be easily manufactured. For example, a photosensitive resin composition is coated and then patterned to form the second planarization layer 42, and a heat polymerized or photosensitive resin composition is coated and then patterned to form the first planarization layer 41. In the OLED display 200, the heat generation particles 60 can be easily arranged under the center portion of the organic layer 52.

Figure 4:
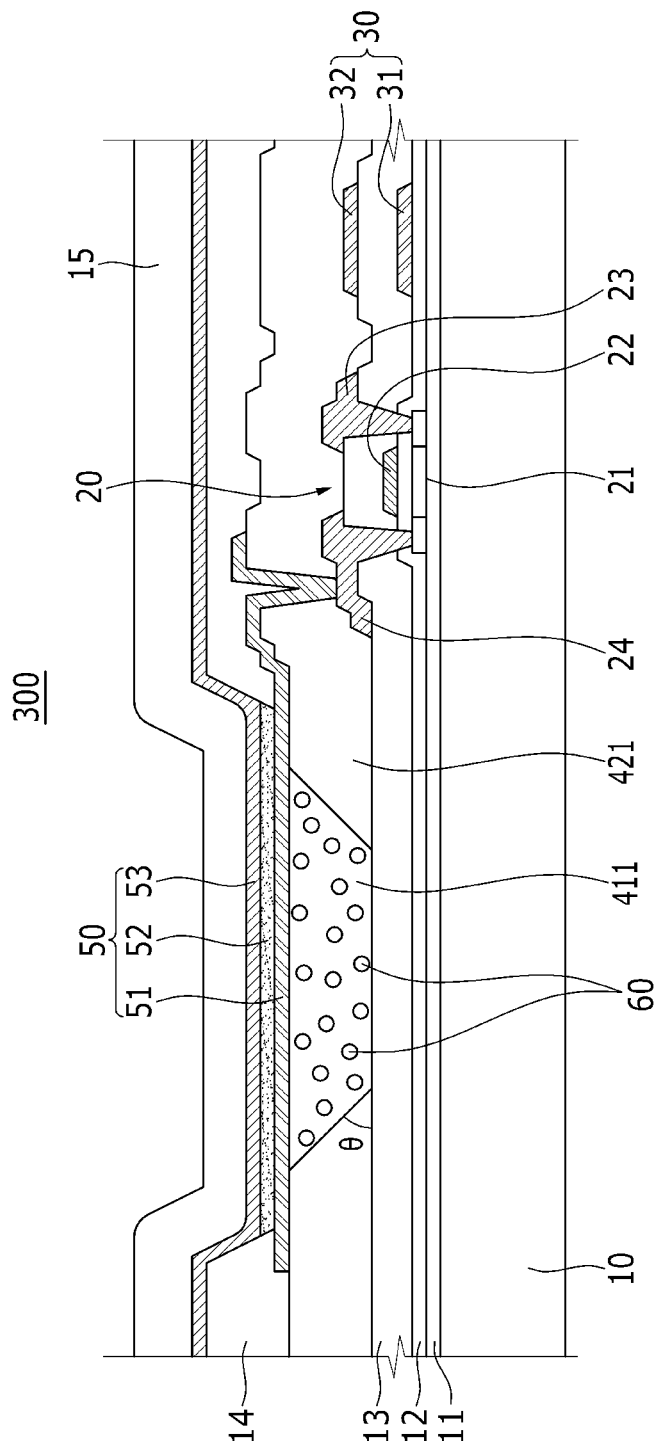
FIG. 4 is a partially enlarged cross-sectional view of an OLED display according to an embodiment.

FIG. 4 is a partially enlarged cross-sectional view of an OLED display according to an embodiment.

Referring to FIG. 4, an OLED display 300 is formed of the same configuration of the OLED display 200, except that sides of a first planarization layer 411 and sides of a second planarization layer 421 are inclined.

Due to the inclined structure of the sides of the first planarization layer 411, the width of the top side contacting a pixel electrode 51 is greater than the width of the bottom side faxing the substrate 10. Due to the inclined structure of the sides of the second planarization layer 421, the width of the top side contacting the pixel defining layer 14 is smaller than the width of the bottom side facing the substrate 10.

The thickness of the first planarization layer 411 including heat generation particles 60 is gradually decreased toward a peripheral area of a pixel. Thus, the number of heat generation particles 60 included in the first planarization layer 411 is gradually decreased farther away from the center of the pixel. That is, the heat generation particles 60 included in the first planarization layer 411 exist with a higher ratio closer to the center of the pixel and exist with a lower ratio farther away from the center of the pixel.

Therefore, the OLED display 300 can more precisely control the temperature of the center portion and the temperature of a peripheral portion of the organic layer 52 of each pixel unit compared to other embodiments, so that the thickness uniformity of the organic layer 52 can be increased. An inclination angle θ of the side of the second planarization layer 421 measured with reference to the bottom side of the second planarization layer 421 may be in a range from about 5° to about 30°.

Figure 5:
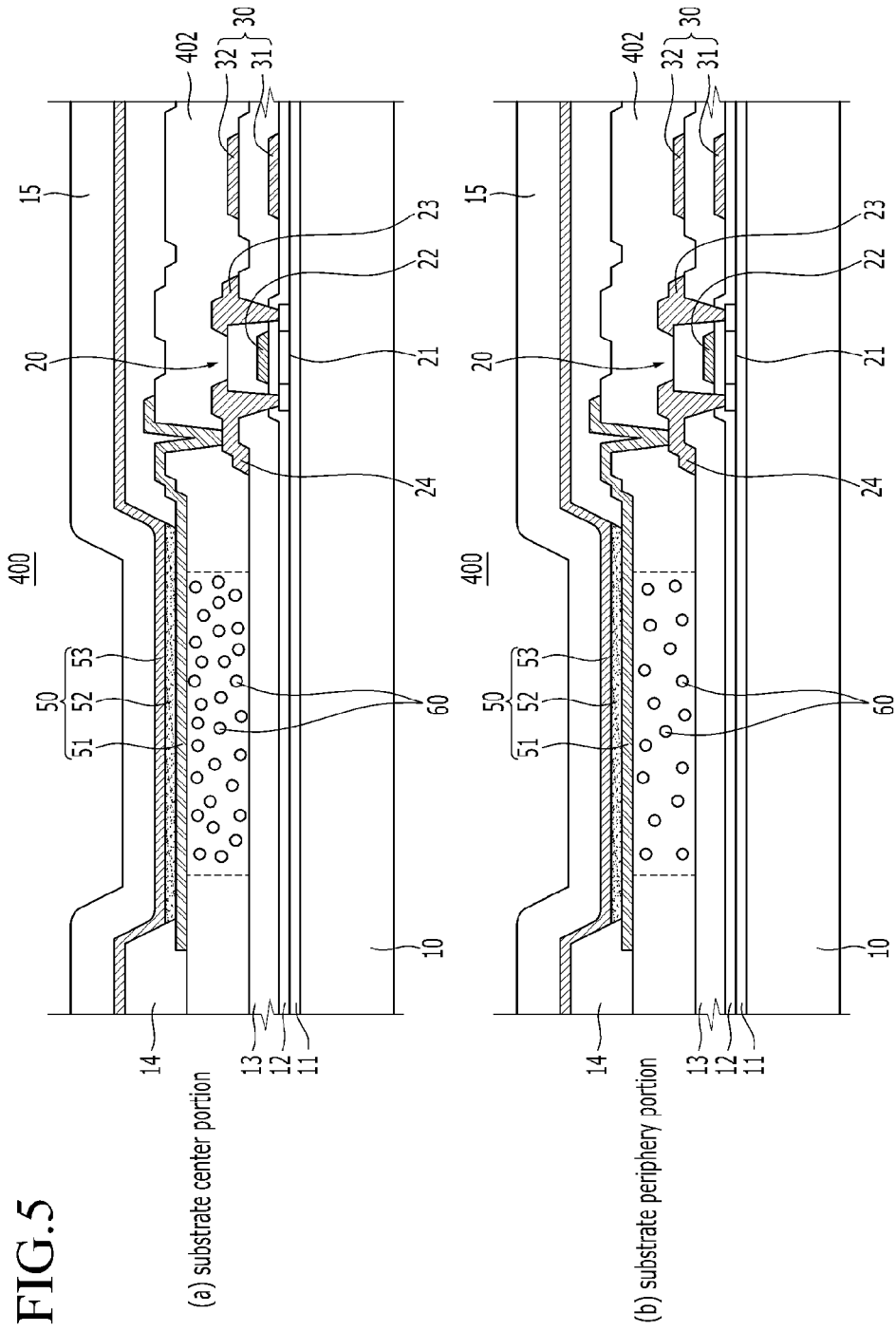
FIG. 5 is a partially enlarged cross-sectional view of an OLED display according to an embodiment.

FIG. 5 is a partially enlarged cross-sectional view of an OLED display according to an embodiment.

Referring to FIG. 5, an OLED display 400 is formed of the same configuration of the OLED display of FIG. 1, 3 or 4, except that the number of heat generation particles 60 included in a planarization layer 402 is changed depending on the location of the heat generation particles 60 on the substrate 10. FIG. 5 illustrates the same configuration as FIG. 1 in terms of constituent elements, and the same reference numerals are used for the same components as those of the first exemplary embodiment.

Figure 6:
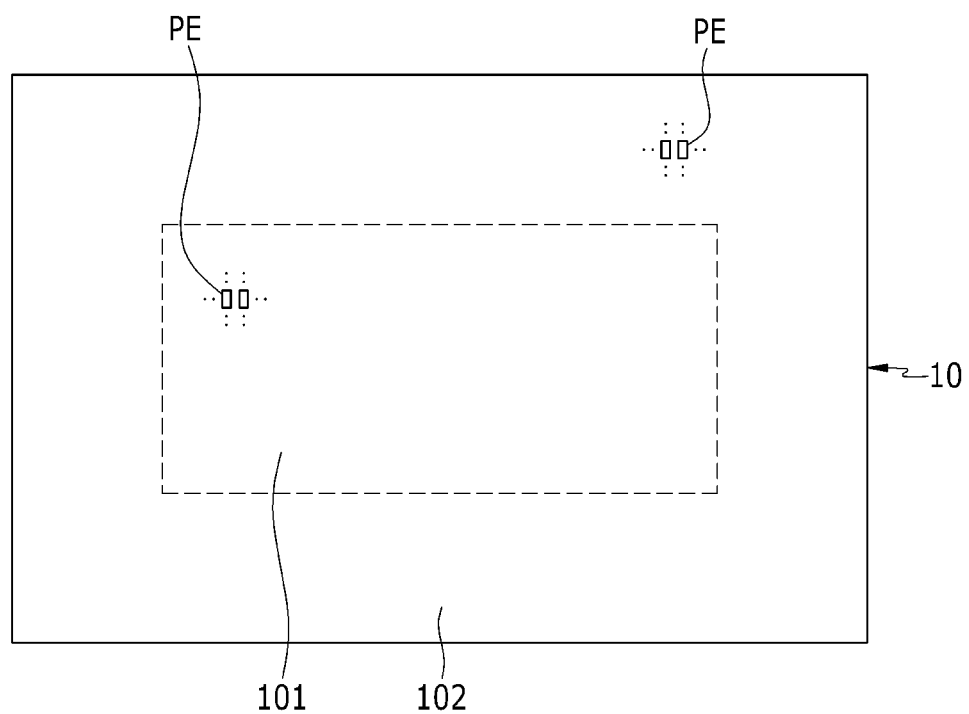
FIG. 6 is an entire top plan view of a substrate of FIG. 5.

FIG. 6 is a top plan view of the substrate of FIG. 5. Referring to FIG. 5 and FIG. 6, the substrate 10 is divided into a center portion 101 and a peripheral portion 102, and a plurality of pixels PE are disposed on the substrate 10.

The drying speed of organic layers 52 of the pixels disposed in the peripheral portion 102 of the substrate 10 may be faster than the drying speed of organic layers 52 of the pixels disposed in the center portion 101 of the substrate 10. The number of heat generation particles 60 of pixels disposed in the center portion 101 of the substrate 10 may be greater than the number of heat generation particles 60 disposed in the peripheral portion 102 of the substrate, and the drying speed of the organic layers 52 of the pixels in the center portion 101 of the substrate 10 can be increased.

The substrate 10 is divided into the center portion 101 and the peripheral portion 102, but the substrate 10 may be divided into a center portion 101 and a plurality of areas (not shown) that are gradually distanced from the center portion 101 as necessary. In addition, each area may have a different number of heat generation particles 60. For example, the number of heat generation particles 60 may be increased moving closer to the center of the substrate 10.

The drying speed of the organic layers 52 of the pixels disposed in the peripheral portion 102 of the substrate 10 may be slower than the drying speed of the organic layers 52 of the pixels disposed in the center portion 101 of the substrate 10, depending on a specification of a manufacturing apparatus. The number of heat generation particles 60 of pixels disposed in the center portion 101 of the substrate 10 may be smaller than the number of heat generation particles 60 of pixels disposed in the peripheral portion 102 of the substrate 10, and the drying speed of the organic layers 52 of the pixels in the peripheral portion 102 of the substrate 10 can be increased. FIG. 6 illustrates the first case as an example.

Figure 7:
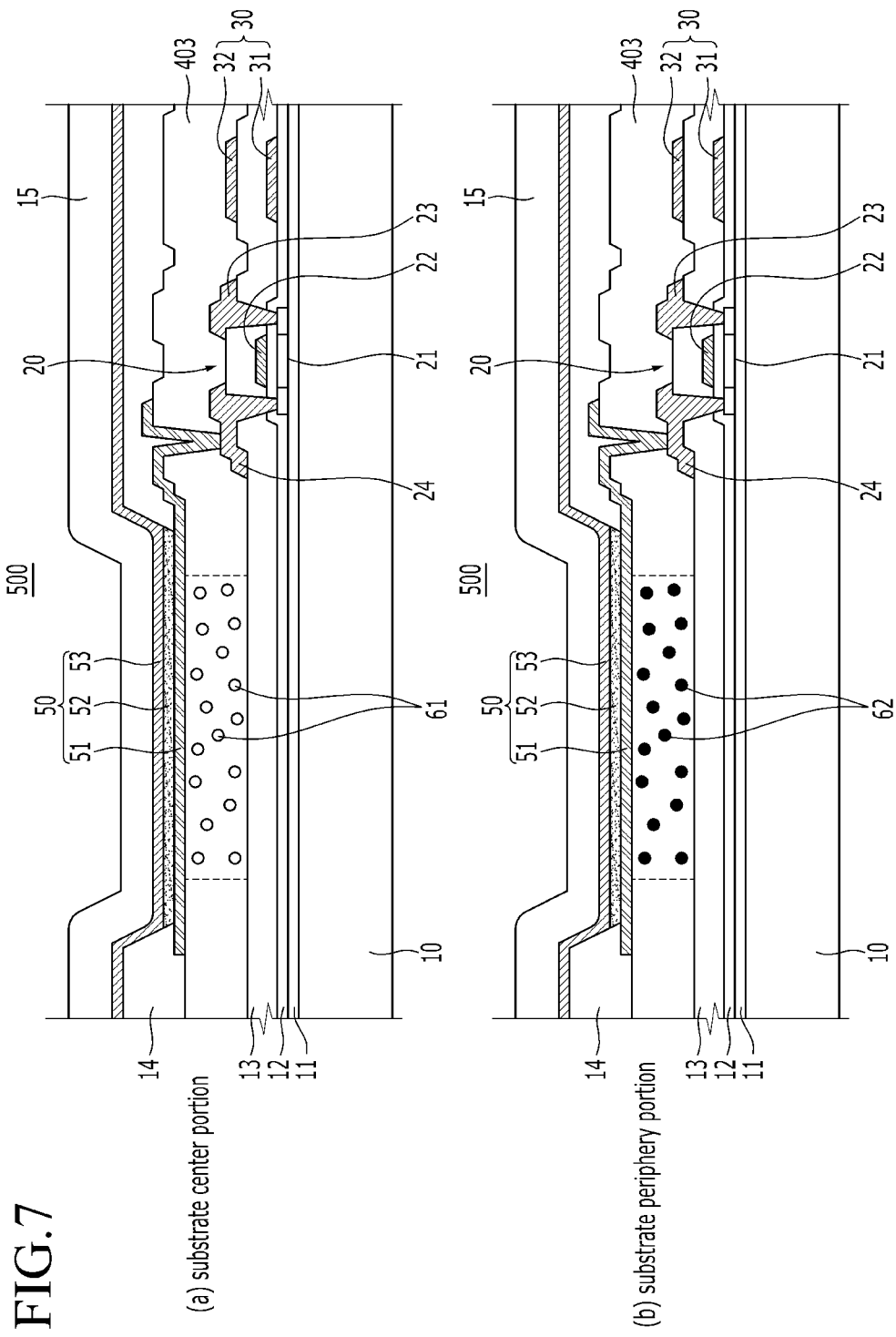
FIG. 7 is a partially enlarged cross-sectional view of an OLED display according to an embodiment.

FIG. 7 is a partially enlarged cross-sectional view of an OLED display according to an embodiment.

Referring to FIG. 7, an OLED display 500 is formed of the same configuration of the OLED display as FIG. 1, 3 or 4, except that different types of heat generation particles 61 and 62 respectively generating different amount of heat are disposed in a planarization layer 403 depending on the location of each of the heat generation particles 61 and 62 on a substrate 10. [0071] As described above, the substrate 10 is divided into a center portion 101 and a peripheral portion 102, and a plurality of pixels PE are disposed on the substrate 10.

The drying speed of organic layers 52 of pixels disposed in the peripheral portion 102 of the substrate 10 may be faster than the drying speed of organic layers 52 of pixels disposed in the center portion 101 of the substrate 10. The planarization layer 403 disposed in the center portion 101 includes first heat generation particles 61 generating a large amount of heat, and a planarization layer 403 disposed in the peripheral portion 102 of the substrate 10 includes second heat generation particles 62 generating a relatively small amount of heat.

When the first heat generation particles 61 and the second heat generation particles 62 are formed of the same metal, the size of the first heat generation particles 61 may be greater than the size of the second heat generation particles 62. When the size of the first heat generation particles 61 and the size of the second heat generation particle 62 are equivalent to each other, the first heat generation particles 61 may be formed of a metal generating a greater amount of heat than the second heat generation particles 62.

The substrate 10 may be divided into two areas, which are the center portion 101 and the peripheral portion 102, or may be divided into a center portion 101 and a plurality of areas gradually distanced from the center portion 101. In addition, the planarization layer 403 may include different types of heat generation particles for each area. For example, an area close to the center of the substrate 10 may include heat generation particles generating a greater amount of heat than other areas.

The drying speed of the organic layers 52 of the pixels disposed in the peripheral portion 102 of the substrate 10 may be slower than the drying speed of the organic layers 52 of the pixels disposed in the center portion 101 of the substrate 10 depending on a specification of a manufacturing apparatus. The planarization layer 403 disposed in the center portion 101 of the substrate 10 includes second heat generation particles 62 generating a small amount of heat and the planarization layer 403 disposed in the peripheral portion 102 of the substrate 10 includes first heat generation particles 61 generating a relatively large amount of heat. FIG. 7 illustrates the first case as an example.

Figure 8:
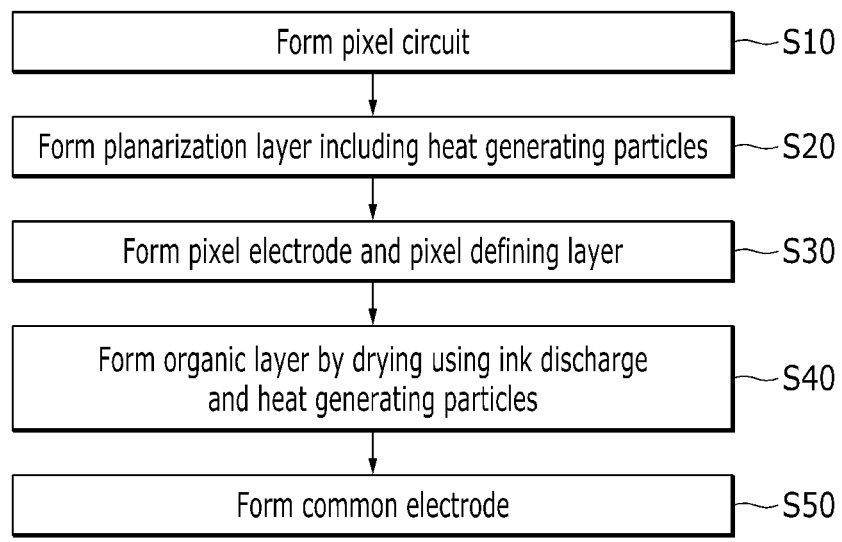
FIG. 8 is a process flowchart of a manufacturing method of an OLED display according to an embodiment.

FIG. 8 is a flowchart of a manufacturing process of an OLED display according to an embodiment.

Referring to FIG. 8, a manufacturing method of an OLED display includes forming a pixel circuit on a substrate (S10), forming a planarization layer including heat generation particles on the substrate to cover the pixel circuit (S20), and forming a pixel electrode and a pixel defining layer on the planarization layer (S30). In addition, the manufacturing method of the OLED display includes forming an organic layer by discharging ink on the pixel electrode and drying the coated ink by emitting heat from heat generation particles with irradiation of microwaves (S40), and forming a common electrode on the organic layer (S50).

At S20, a planarization layer 40 includes heat generation particles 60 in an area corresponding to a center portion of a pixel. The planarization layer 40 may be divided into a first area A10 corresponding to the center portion of an organic layer 52 and a second area A20 corresponding to a peripheral area of the organic layer 52, and the heat generation particles are disposed in the first area A10.

Alternatively, the planarization layer 40 may be formed of first planarization layers 41 and 411 corresponding to the center portion of the organic layer 52, and second planarization layers 42 and 421 corresponding to the peripheral portion of the organic layer 52, and the heat generation particles 60 are disposed in the first planarization layers 41 and 411.

Figure 9:
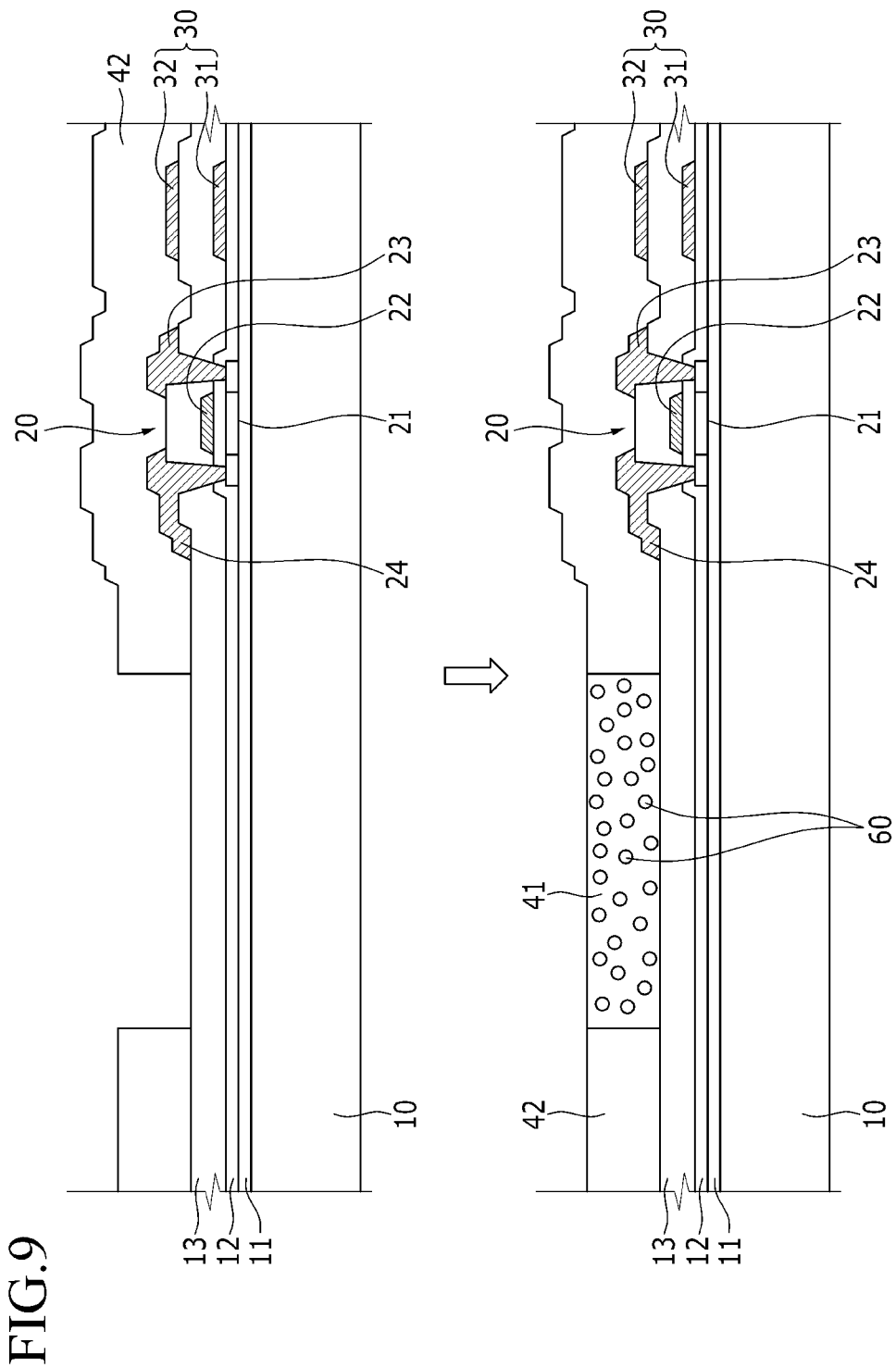
FIG. 9 is a partially enlarged cross-sectional view of the OLED display during the manufacturing method of FIG. 8.

FIG. 9 is a partially enlarged cross-sectional view of the OLED display in S20 of FIG. 8. FIG. 9 illustrates that the planarization layer is formed of the first planarization layer 41 and the second planarization layer 42, as an example.

Referring to FIG. 9, a photosensitive resin composition is coated on the substrate 10 where pixel circuits 20 and 30 are formed, and then the coated photosensitive resin composition is patterned to form the second planarization layer 42 corresponding to the peripheral portion of the organic layer. Next, a heat polymerized resin or a photosensitive resin composition including the heat generation particles 60 is coated and then patterned to form the first planarization layer 41 corresponding to the center portion of the organic layer. With such a method, the heat generation particles 60 can be easily arranged below the center portion of the organic layer.

FIG. 10 is a partially enlarged cross-sectional view of the OLED display in S40 of FIG. 8.

Referring to (a) of FIG. 10, a liquid-type ink including an organic material and a solvent is discharged onto a pixel electrode 51 using a method such as an inkjet method or a nozzle printing method. The ink coated on the pixel electrode 51 may be wholly convex upward due to surface tension.

In this state, with application of a conventional drying method such as heat drying, step-down drying, vacuum drying, infrared drying, and the like, the solvent in the peripheral portion is quickly evaporated such that the organic layer is formed with a non-uniform thickness. In this case, the light emission characteristic and efficiency and the life-span of the OLED display are deteriorated.

Referring to (b) and (c) of FIG. 10, the heat generation particles 60 are heated by irradiating microwaves. Then, heat discharged from the heat generation particles 60 dries the coated ink so that the organic layer 52 is completed.

Since the heat generation particles 60 are disposed below the center portion of the organic layer 52 of each pixel, the evaporation speed of the solvent of each pixel can be controlled to be uniform by increasing the heating temperature of the peripheral portion of the organic layer 52. Accordingly, the organic layer 52 having a uniform thickness can be formed for each pixel unit.

The organic layer 52 formed with the above-stated process may include a hole injection layer (HIL) 522, a hole transport layer (HTL) 523, and an emission layer (EL) 521, and a dry process using ink discharge and the heat generation particles 60 is individually performed on each layer.

The hole injection layer 522 may be formed on the pixel electrode 51 through a drying process using the ink discharge and heat generation particles, the hole transport layer 523 may be formed on the hole injection layer 522 through the same drying process, and the emission layer 521 may be formed on the hole transport layer 523 through the same drying process. An organic material of the ink for forming each layer is different from one another.

Through the above-stated process, a drying condition of ink can be precisely controlled for each pixel unit, and the uniformity of the thickness of the organic layer 52 can be increased.

While this invention has been described in connection with certain embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting diode (OLED) display comprising:
    a pixel circuit formed on a substrate;
    a planarization layer covering the pixel circuit; and
    an organic light emitting diode disposed on the planarization layer, wherein the organic light emitting diode including a pixel electrode, an organic layer, and a common electrode,
    wherein the planarization layer comprises heat generation particles emitting heat through microwave irradiation.

2. The OLED display of claim 1, wherein the organic layer comprises an emission layer, and at least one of a hole injection layer, a hole transport layer, an electron transport layer, and an electron injection layer.

3. The OLED display of claim 2, wherein the at least one of the hole injection layer and the hole transport layer are disposed between the pixel electrode and the emission layer, and the at least one of the hole injection layer and the hole transport layer, and the emission layer are formed using a printing method.

4. The OLED display of claim 1, wherein the heat generation particles comprise at least one of a metal, a ceramic, or a silicon carbide-based material.

5. The OLED display of claim 1, wherein the planarization layer is divided into a first area corresponding to a center portion of the organic layer and a second area corresponding to a peripheral portion of the organic layer, and wherein the heat generation particles are dispersed in the first area.

6. The OLED display of claim 1, wherein the planarization layer is formed of a first planarization layer including the heat generation particles and a second planarization layer not including the heat generation particles.

7. The OLED display of claim 6, wherein the first planarization layer corresponds to a center portion of the organic layer and the second planarization layer corresponds to a peripheral portion of the organic layer.

8. The OLED display of claim 7, wherein sides of the first planarization layer and sides of the second planarization layer include inclined surfaces, and a quantity of heat generation particles is gradually decreased moving farther away from the center of the organic layer.

9. The OLED display of claim 5, wherein the substrate is divided into a center portion and a peripheral portion, and wherein a number of heat generation particles disposed in the center portion of the substrate is different from a number of heat generation particles disposed in the peripheral portion of the substrate.

10. The OLED display of claim 9, wherein the number of heat generation particles disposed in the center portion of the substrate is greater than the number of heat generation particles disposed in the peripheral portion of the substrate.

11. The OLED display of claim 5, wherein the substrate is divided into a center portion and a peripheral portion, and the heat generation particles comprise first heat generation particles disposed in the center portion of the substrate and second heat generation particles disposed in the peripheral portion of the substrate, wherein the second heat generation particles are configured to generate a different amount of heat than the first heat generation particles.

12. The OLED display of claim 11, wherein the amount of heat generated from the first heat generation particles is greater than the amount of heat generated from the second heat generation particles.

13. A method for forming an organic light emitting diode (OLED) display, the method comprising:
forming a pixel circuit on a substrate;
forming a planarization layer on the substrate to cover the pixel circuit, wherein the planarization layer includes heat generation particles;
forming a pixel electrode and a pixel defining layer on the planarization layer;
forming an organic layer by discharging ink on the pixel electrode and drying the ink by generating heat from the heat generation particles through microwave irradiation; and
forming a common electrode on the organic layer.

14. The method of claim 13, wherein, forming the planarization layer comprises forming a first planarization layer corresponding to a center portion of the organic layer and including the heat generation particles and forming a second planarization layer corresponding to a peripheral portion of the organic layer.

15. The method of claim 14, wherein sides of the first planarization layer and sides of the second planarization layer are formed with inclined surfaces, and a number of heat generation particles is gradually decreased moving farther away from a center of the organic layer.

16. The method of claim 13, wherein the substrate is divided into a center portion and a peripheral portion, and wherein a number of heat generation particles disposed in the center portion is different from a number of heat generation particles disposed in the peripheral portion.

17. The method of claim 13, wherein the substrate is divided into a center portion and a peripheral portion, and wherein heat generation particles disposed in a center portion of the substrate generate an amount of heat different from an amount of heat generated from heat generation particles disposed in a peripheral portion of the substrate.

18. The method of claim 13, wherein the organic layer comprises a hole injection layer, a hole transport layer, and an emission layer, and the ink discharging and drying process is performed on at least one of the hole injection layer, the hole transport layer, and the emission layer.

* * * * *

UNITED STATES PATENT AND TRADEMARK OFFICE
CERTIFICATE OF CORRECTION

| | | |
|---|---|---|
| PATENT NO. | : 8,988,622 B2 | Page 1 of 1 |
| APPLICATION NO. | : 14/151140 | |
| DATED | : March 24, 2015 | |
| INVENTOR(S) | : Takii | |

It is certified that error appears in the above-identified patent and that said Letters Patent is hereby corrected as shown below:

In the specification

Column 6, line 11, delete "ion" and insert -- iron --, therefor.

Signed and Sealed this
Twenty-second Day of December, 2015

Michelle K. Lee
*Director of the United States Patent and Trademark Office*